INVENTORS
EGON SCHULZ
JOSEF HEHNEN
BY [signature]
ATTORNEY

INVENTORS
EGON SCHULZ
JOSEF HEHNEN
BY Percy P. Lantzy
ATTORNEY

United States Patent Office 3,453,503
Patented July 1, 1969

3,453,503

MULTIPLE EMITTER TRANSISTOR WITH IMPROVED FREQUENCY AND POWER CHARACTERISTICS

Egon Schulz and Josef Hehnen, Freiburg im Breisgau, Corporation, New York, N.Y., a corporation of Delaware Filed Mar. 21, 1966, Ser. No. 535,807
Claims priority, application Germany, Apr. 22, 1965, J 27,970
Int. Cl. H01l 13/02
U.S. Cl. 317—235 5 Claims

ABSTRACT OF THE DISCLOSURE

This is a high frequency power transistor having a plurality of separate emitter regions embedded in a base region extending from one surface of the semiconductor body. The emitter regions extend out from square sides of the semiconductor body towards the center and are tapered toward the diagonals of the square. This configuration creates a large edge length for the emitter for a small given total surface area as possible and provides for distributing the leakage power equally throughout the surface.

This invention relates to semiconductor devices and more particularly to a junction transistor.

There is known a four-layer type semiconductor arrangement in which a base region within an emitter region subdivided to the shape of circular ring segments, is led to the surface of a plate-shaped semiconductor body. Such and similar structures in which one or several regions starting out from a surface of a plate-shaped semiconductor body, are embedded therein, are produced, as is well-known, with the aid of masking oxide layers by employing the well-known techniques of photolithography. In this connection reference is made to the well-known method of producing planar transistors.

The present invention is above all concerned with the structure of a power transistor which is particularly suitable for being used for high frequency purposes with a grounded emitter. The invention is particularly aimed at providing coaxial structures, in particular with an emitter contacted at the outer edge of the semiconductor wafer. Moreover, the invention is supposed to meet the requirements which are to be demanded from a high-frequency power transistor with respect to a large as possible edge length of the emitter, of a small as possible total surface, and of a leakage power which is distributed as equally as possible throughout the surface.

The present invention relates to a junction transistor whose regions are led to the surface of a plate-shaped semiconductor body. According to the invention the aforementioned requirements are met in that the collector region, within the base region, is led to one surface of a plate-shaped semiconductor body, in that in the base region a plurality of separate emitter regions uniformly covering the base region, are embedded by starting out from this surface of the semiconductor body, and in that the semiconductor surface comprises a layer of insulating material which, within and at least between the emitter regions comprises recesses leading to both the emitter regions and the base region for the purpose of establishing contacts with the aid of electrically conducting layers.

The invention will be explained in detail with reference to the copending drawings.

Figures 1, 2:
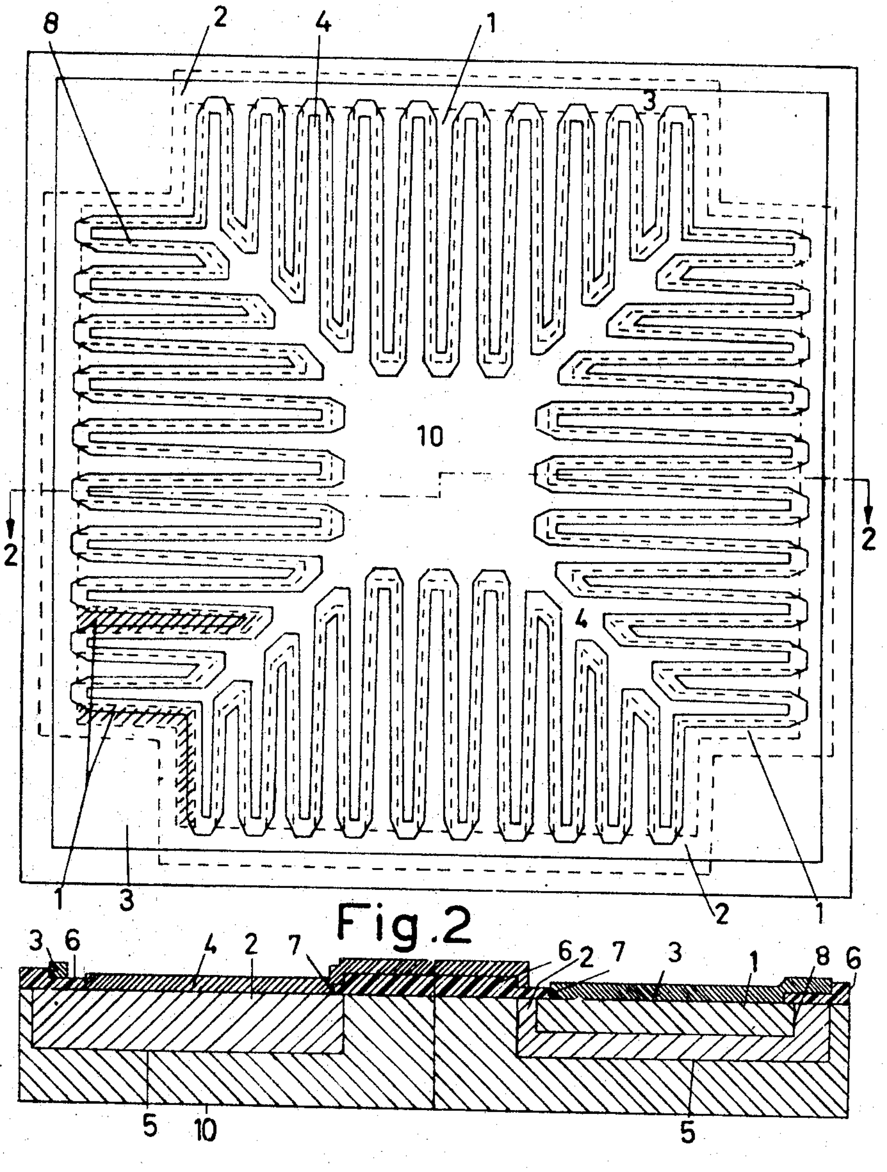
FIG. 1 shows in a plan view a junction transistor according to the invention with a square-type electrode structure on a square-type semiconductor wafer.
FIG. 2 shows a section taken on line 2—2 of the transistor shown in FIG. 1 in a plan view.

For producing a plurality of npn-type junction transistors according to the invention it is possible to proceed, for example, as follows:

First of all an insulating layer 6 of silicon oxide is produced on a semiconductor plate of silicon of n-type conductivity, by way of thermal oxidation. In this layer, and by using the photolithographic technique, and by a subsequent treatment in an etching agent attacking the oxide layer at the non-masked parts, apertures are produced in the manner known per se, through which the base regions 2 of the transistors of p-type conductivity, are diffused into the semiconductor plate. Thereafter, an oxidation is carried out again for the purpose of producing the emitter regions, so that there will result a continuous layer of silicon oxide. In this oxide layer, and in the same manner as described hereinbefore, there are produced apertures for diffusing the emitter regions 1. Thereupon the semiconductor plate is subjected to a phosphor diffusion by using a $P_2O_5$-source. In the course of this there are produced the emitter regions 1 of n-type conductivity, and a phosphor glass is produced in the apertures of the masking layer of silicon oxide. During a subsequent thermal oxidation in the course of which a continuous layer of silicon oxide is produced on the entire semiconductor surface, the phosphor glass in the apertures is converted into silicon oxide. On this, and in the same way as already mentioned hereinbefore, within and at least between the emitter regions, there are produced recesses 7 extending to both the emitter regions and the base region, for the purpose of establishing contacts.

For providing both the emitter regions 1 and the base region 2 with contacts, a metallic layer, e.g. of aluminum, may be deposited first of all throughout the entire surface of the semiconductor plate into which both the base regions and the emitter regions have been diffused. In order to enable a separate contacting of both the emitter regions 1 and the base region 2 of each individual transistor, the pn-junctions 8 between the emitter regions 1 and the base region 2, with the exception of those parts which are supposed to remain covered for establishing a connection between the emitter regions 1 and the outer surface area of the metallic layer 3, are etched out.

The surface of each of the thus obtained elements is thus, with the exception of the etched-out portions, equally covered with two metallic layers which are separated from one another. After the semiconductor plate has been divided into individual junction transistors by way of breaking apart, or by using a tool employing ultrasonic waves and an abrasive dispersion there will be obtained junction transistors according to the drawings. Accordingly, the metal layer 3 only touches the semiconductor surface at the points of the emitter regions 1. The detrimental lead-in capacities are the smaller the thicker the oxide layer is.

The mounting of the contacts to the base region 2 which, at the semiconductor surface, is limited by the pn-junctions 5, is effected via the metal layer 4. This metallic layer 4 is required to touch the base region 2 at least between the emitter regions 1, and to establish the contact therewith. To this end the insulating layer 6 is there likewise provided with recesses 7. Of course, the metal layer 4 may also touch and establish contacts with the base region outside the ranges between the emitter regions 1.

The lead-in electrode extending to the base region, in the examples of embodiment shown in the drawings, is mounted at the center of symmetry of the metallic layer 4 arranged on the insulating layer. There the collector region 10, within the base region, is led to the surface of the semiconductor body which is common to all regions. By providing such an embodiment, the surface of the pn-junction between the base and the collector region and, consequently, the pn-space charge capacitance is reduced. Instead of a pn-space charge capacity which would have to lie at the contacting surface of the lead-in electrode extending to the base region if the collector region 10 would at this point not be led through the base region 2, the inventive type of junction transistor is provided with a capacitance which is determined by the surface of the collector region at the center of symmetry, and by the thickness of the insulating layer.

This capacitance, however, unlike the pn-space charge capacitance in the case of smaller collector voltages, is voltage independent and may be kept very small. The same points of view also apply to the case where, after a corresponding embodiment of the contacting layers, the emitter regions are contacted over the portion of the collector region which is held to the surface within the base region. In the course of this a portion of the capacitance between the emitter and the collector region will become independent of the voltage between the collector and the emitter.

Within the surface which is circumscribed by the inner base-collector-pn junction 5, the collector region 10 which, at this point meets against the surface of the semiconductor body, is thus electrically separated from the metal layer 4 by the insulating layer. For reducing the capacitance between the metal layer 4 and the collector region 10 meeting against the semiconductor surface within the range of the inner collector-base-pn junction 5, a non-contacted region of the opposite conductivity type with respect to the collector region, may there be embedded in the semiconductor body. However, for effecting a further reduction of the capacitance a blocking voltage with respect to the collector region, may also be applied to this region via an additional electrode.

FIG. 1 shows a junction transistor according to the invention comprising a semiconductor body of square basic surface. In the semiconductor body, vertically and extending from the sides of the square, there are embedded strip-shaped emitter regions 1 which are tapered towards the inside, extending up into the neighbourhood of the diagonals of the square and of the pn-junction 5 between the base and the collector region. The tapering of the emitter regions 1 according to FIG. 1 has the advantage that slight lead-in resistances will result at the emitting ranges of the emitter regions.

Figure 3:
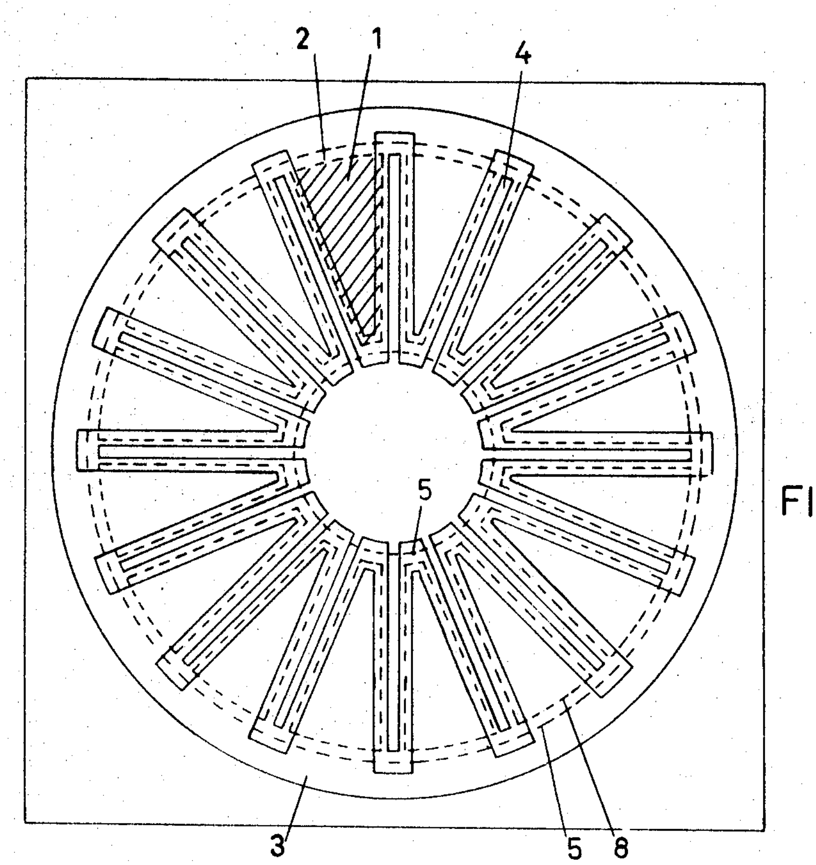
FIG. 3 shows a junction transistor particularly suitable for coaxial structures, according to the invention, comprising a radial-symmetrical electrode structure.
Figure 4:
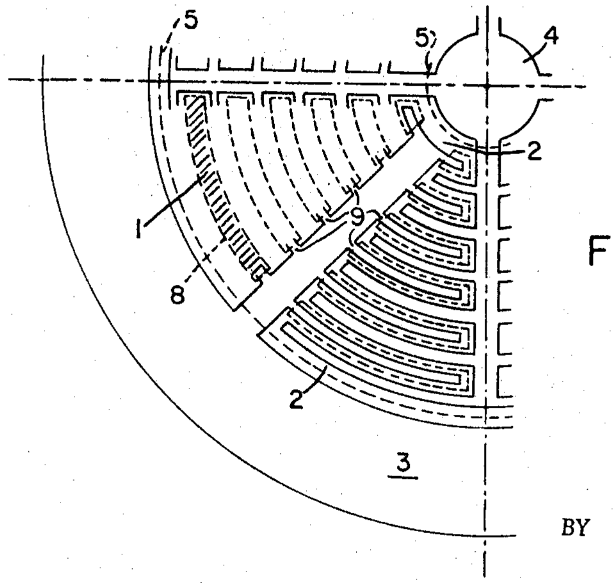
FIG. 4 illustrates a sectional further embodiment of the junction transistor according to FIG. 3 for handling a higher high-frequency output.

The junction transistors according to FIGS. 3 and 4 are particularly suitable for establishing contacts with a coaxial line. In the course of this the inner conductor of the coaxial line is connected to the metal layer 4, and the outer conductor of the coaxial line is connected to the metal layer 3. The electrical connection may be established via pressure contacts.

The junction transistor according to FIG. 3 comprises emitter regions 1 in the shape of circular or ring segments. For the purpose of enabling a better understanding one emitter region 1 is indicated by hatch lines in FIG. 3.

With respect to higher high-frequency outputs it is suitable to provide a transistor as partly shown in FIG. 4. Therein, each circular segment of FIG. 3 is subdivided into concentric strips. In this way there is obtained a larger emitting edge of the emitter. For reasons of clarity, the contacting parts of the metal layers 3 and 4 are missing in one circular segment of FIG. 4. On account of this the shape of the emitter regions, i.e. the concentric strips, which are respectively separated by a pn-junction 8 from the base region, becomes particularly evident.

A substantial advantage of the transistor according to the invention still resides in the fact that it, on the emitter side, may be built up with a low inductance on a transistor base, because the electrical lead-in to the emitter may be kept short.

With the aid of transistor according to FIG. 1 whose semiconductor body has a length of edge of about 1 mm., it is possible, for example, at 200 mc. and a collector voltage of 30 volts, to achieve an output of about 4.5 w. with a power gain of about 10 db. In this case the semiconductor body is soldered to a metallic part of the housing of the transistor, so that the latter is in a well-heat conducting contact with the collector. Via the metallic casing care is taken for a sufficient transfer of the dissipated heat.

What is claimed is:

1. A junction transistor comprising:

a semiconductor body having a square surface, a plurality of emitter regions of a first conductivity type, a base region of a second conductivity type and a collector region of said first conductivity type;

said emitter regions extending from the surface of said body into said base region forming a pn-junction with said base region;

said base region extending from the surface of said body into said collector region forming a semiconductor junction with said collector region;

said emitter regions extending in a tapered finger-like fashion from the sides of said square towards the center of the surface of said body;

said collector region extending to the surface of said body in the center of symmetry of said body, the extended portion of said collector region being surrounded by said base region at the surface; and an insulating layer on the surface of said body completely covering the portion of said collector region that extends to said surface, said insulating layer within and between said emitter region includes recesses extending to said emitter regions and to said base region whereby contacts thereto can be established with electrically conducting layers.

2. A junction transistor according to claim 1 wherein within the surface area of said collector region extending to the surface of said semiconductor body, at least one region with an opposite conductivity type with respect to the said collector region, is embedded in said collector region.

3. A junction transistor according to claim 1, wherein on the surface of said insulating layer and extending to a small distance from its edge, for the purpose of establishing separate contacts between said emitter regions and said base region there are provided two metallic layers not covering the pn-junctions between said emitter regions and said base region, with the exception of those parts which remain covered for connecting said emitter regions to the portion of one of said metallic layers serving the establishment of their contacts.

4. A junction transistor according to claim 3, wherein the layer establishing the contact with the said emitter regions, surrounds the layer establishing the contact with said base region.

5. A junction transistor according to claim 4, wherein the lead-in electrode extending to the base region is arranged at the centre of symmetry of said metallic layer disposed on said insulating layer.

References Cited

UNITED STATES PATENTS

| | | | |
|---|---|---|---|
| 3,166,448 | 1/1965 | Hubner | 148—177 |
| 3,214,652 | 10/1965 | Knowles | 317—235 |
| 3,287,610 | 11/1966 | Reber | 317—234 |
| 3,309,585 | 3/1967 | Forrest | 317—234 |
| 3,325,706 | 6/1967 | Kruper | 317—235 |
| 3,331,001 | 7/1967 | Luce et al. | 317—235 |
| 3,368,123 | 2/1968 | Rittmann | 317—235 |

OTHER REFERENCES

Electronics, Aug. 23, 1965: "The Overlay Transistor, Part I: New Geometry Boosts Power," by R. Corley, P. McGeough, J. O'Brien (pp. 71–76).

Motorola Monitor, vol. 3, No. 1, 1965: "Power At High Frequencies," p. 7.

JOHN W. HUCKERT, *Primary Examiner.*

R. SANDLER, *Assistant Examiner.*

U.S. Cl. X.R.

29—569

UNITED STATES PATENT OFFICE

CERTIFICATE OF CORRECTION

Patent No. 3,453,503 July 1, 1969

Egon Schulz et al.

It is certified that error appears in the above identified patent and that said Letters Patent are hereby corrected as shown below:

In the heading to the printed specification, line 5, after "Breisgau," insert -- Germany, assignors to International Standard Electric --.

Signed and sealed this 3rd day of November 1970.

(SEAL)
Attest:

Edward M. Fletcher, Jr.
Attesting Officer

WILLIAM E. SCHUYLER, JR.
Commissioner of Patents